（12） United States Patent
Tsai

(10) Patent No.: US 11,777,007 B2
(45) Date of Patent: Oct. 3, 2023

(54) METHOD FOR FABRICATING MEMORY DEVICE

(71) Applicant: United Microelectronics Corp., Hsinchu (TW)

(72) Inventor: Chin-Chin Tsai, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 448 days.

(21) Appl. No.: 17/204,642

(22) Filed: Mar. 17, 2021

(65) Prior Publication Data

US 2021/0202707 A1 Jul. 1, 2021

Related U.S. Application Data

(62) Division of application No. 16/408,214, filed on May 9, 2019, now Pat. No. 10,991,806.

(51) Int. Cl.
*H01L 29/792* (2006.01)
*H01L 29/423* (2006.01)
*H01L 21/02* (2006.01)
*H01L 21/762* (2006.01)
*H01L 29/66* (2006.01)

(52) U.S. Cl.
CPC .. *H01L 29/42344* (2013.01); *H01L 21/02238* (2013.01); *H01L 21/76224* (2013.01); *H01L 29/66833* (2013.01); *H01L 29/792* (2013.01)

(58) Field of Classification Search
None
See application file for complete search history.

(56) References Cited

U.S. PATENT DOCUMENTS

| | | |
|---|---|---|
| 7,211,858 B2 | 5/2007 | Prinz |
| 8,575,683 B1 | 11/2013 | Shih |
| 2005/0245028 A1 | 11/2005 | Lee |
| 2006/0011966 A1 | 1/2006 | Wang |
| 2009/0186459 A1 | 7/2009 | Chen |
| 2010/0308392 A1 | 12/2010 | Nagai |
| 2014/0151782 A1 | 6/2014 | Tsair et al. |
| 2014/0264632 A1 | 9/2014 | Richter et al. |
| 2015/0048439 A1 | 2/2015 | Shum et al. |
| 2015/0072489 A1 | 3/2015 | Baker, Jr. et al. |
| 2015/0380568 A1 | 12/2015 | Tseng et al. |
| 2016/0043097 A1 | 2/2016 | Huang et al. |
| 2016/0087058 A1 | 3/2016 | Perera et al. |
| 2016/0099153 A1 | 4/2016 | Swift et al. |
| 2016/0240665 A1 | 8/2016 | Chen et al. |
| 2016/0365350 A1 | 12/2016 | Chuang et al. |
| 2017/0069648 A1 | 3/2017 | Yamaguchi |
| 2018/0090365 A1 | 3/2018 | Kamoshima et al. |

(Continued)

*Primary Examiner* — William C Trapanese
(74) *Attorney, Agent, or Firm* — J.C. PATENTS

(57) ABSTRACT

A method for fabricating memory device is provided. The method comprises forming a cell structure on a substrate, wherein the cell structure comprises a first gate structure and a second gate structure disposed on a substrate and an insulating layer in contact between the first gate structure and the second gate structure, wherein the first gate structure and the second gate structure are planarized and the first gate structure is for storing charges. Further, the first gate structure and the second gate structure are patterned to have a shallow indent above the insulating layer. An isolation structure is formed in the shallow indent to have a shallow indent isolation.

7 Claims, 13 Drawing Sheets

(56) References Cited

U.S. PATENT DOCUMENTS

| | | |
|---|---|---|
| 2019/0057970 A1 | 2/2019 | Sun et al. |
| 2019/0123060 A1 | 4/2019 | Wang |
| 2019/0165115 A1 | 5/2019 | Lin et al. |
| 2019/0229122 A1 | 7/2019 | Cai et al. |
| 2020/0006566 A1* | 1/2020 | Chien .................. H01L 29/792 |
| 2020/0091005 A1 | 3/2020 | Gao et al. |

* cited by examiner

METHOD FOR FABRICATING MEMORY DEVICE

CROSS-REFERENCE TO RELATED APPLICATION

This application is a divisional application of and claims the priority benefit of U.S. application Ser. No. 16/408,214, filed on May 9, 2019, now allowed. The entirety of the above-mentioned patent application is hereby incorporated by reference herein and made a part of specification.

BACKGROUND

1. Field of the Invention

The present invention generally relates to semiconductor fabrication, and particularly to a memory device and method for fabricating the memory device.

2. Description of Related Art

The non-volatile semiconductor memory has been very widely used to store data permanently as the digital information produced by various digital electronic apparatus, such as camera, video apparatus, mobile phone, flat computer, computer system, . . . , and so on. The non-volatile semiconductor memory has been a very popular tool to store a large amount of information.

The digital information is produced more and more in daily life due to the great development of digital electronic apparatus, in an example. So, the memory with large storage capability is really intended. In this situation, the cell size of memory is then needed to be reduced, so to increase the storage capability while the actual volume of the memory may also be reduced for easy carrying. In addition, the performance of the memory cell may get worse, while the cell sized is reduced, in which the memory cell may lose the data as store, or even cannot correctly store the data as to be stored.

As the development on designing the non-volatile memory cell, two-transistor (2T) SONOS memory cell has been proposed, in which SONOS represents a stack of silicon-oxide-nitride-oxide-silicon. For the 2T SONOS memory cell, it includes a selection gate structure and a memory gate structure. The gate insulating layer for the selecting gate structure is a usually dielectric layer. A memory stack for the storage gate structure includes a structure of ONO (oxide-nitride-oxide) for keeping charges so to store the bit data.

How to design the 2T SONOS memory cell to improve the performed is still an issue in further development.

SUMMARY OF THE INVENTION

The invention provides a structure of memory device and method for fabricating the memory device. The memory device may include 2T SONOS memory cell. An isolation capability between the two gate structures, such as selection gate and the storage gate may be improved.

In an embodiment, a structure of memory device is provided. The structure of memory device includes a first gate structure, disposed on a substrate, wherein the first gate structure is for storing charges. In addition, a second gate structure is disposed on the substrate. An insulating layer is in contact between the first gate structure and the second gate structure. An isolation structure integrated with the insulating layer is between the first gate structure and the second gate structure and at a top portion of the first gate structure and the second gate structure. The isolation structure provides an isolation distance between the first gate structure and the second gate structure.

In an embodiment, as to the structure of memory device, the first gate structure comprises: a charge storage layer on the substrate and a control gate on the charge storage layer. The second gate structure comprises a gate insulation layer on the substrate and a selection gate on the gate insulation layer.

In an embodiment, as to the structure of memory device, the charge storage layer of the first gate structure comprises a structure of oxide-nitride-oxide (ONO).

In an embodiment, as to the structure of memory device, the isolation structure is a shallow indent isolation above the insulating layer and horizontally extends into the first gate structure and the second gate structure.

In an embodiment, as to the structure of memory device, the first gate structure and the second gate structure have an indent space above the insulating layer. The shallow indent isolation comprises a liner layer on a surface of the indent space and a dielectric layer on the liner layer to fill the indent space.

In an embodiment, as to the structure of memory device, the memory device further comprises a silicide layer on a top of the second gate structure.

In an embodiment, as to the structure of memory device, the isolation structure is at a peripheral top region of the first gate structure, extending from the insulating layer inward to the first gate structure.

In an embodiment, as to the structure of memory device, the insulating layer comprises a first insulating layer at a bottom portion of a sidewall of the first gate structure under the isolation structure and a second insulating layer merging with the isolation structure on the sidewall of the first gate structure. The second insulating layer comprises a first portion covering the first insulating layer, and a second portion merged with the isolation structure covering on the peripheral top portion of the first gate structure.

In an embodiment, the invention also provides a method for fabricating memory device. The method comprises forming a cell structure on a substrate, wherein the cell structure comprises a first gate structure and a second gate structure disposed on a substrate and an insulating layer in contact between the first gate structure and the second gate structure, wherein the first gate structure and the second gate structure are planarized and the first gate structure is for storing charges. Further, the first gate structure and the second gate structure are patterned to have a shallow indent above the insulating layer. An isolation structure is in the shallow indent to have a shallow indent isolation.

In an embodiment, as to the method for fabricating memory device, the step of forming the isolation structure comprises forming a liner layer on a sidewall and a bottom of the shallow indent and forming an isolation layer to further fill the shallow indent.

In an embodiment, as to the method for fabricating memory device, the method further comprises forming a silicide layer on a top the second gate structure.

In an embodiment, as to the method for fabricating memory device, the first gate structure comprises a charge storage layer on the substrate and a control gate on the charge storage layer. The second gate structure comprises a gate insulation layer on the substrate and a selection gate on the gate insulation layer.

In an embodiment, as to the method for fabricating memory device, the charge storage layer of the first gate structure has a structure of oxide-nitride-oxide (ONO).

In an embodiment, as to the method for fabricating memory device, forming the cell structure comprises forming an oxide layer on the substrate. In addition, a first-stage first gate structure is formed, having a charge storage layer with a portion of the oxide layer on the substrate, a first polysilicon layer on the charge storage layer, a dielectric layer on the first polysilicon layer, a second polysilicon layer on the dielectric layer, and a sidewall insulating layer on a sidewall of the first polysilicon layer, the dielectric layer and the second polysilicon layer. A third polysilicon layer is formed over the first-stage first gate structure and the oxide layer on the substrate. The third polysilicon layer, the sidewall insulating layer and the second polysilicon layer are polished until the dielectric layer is exposed. The second polysilicon layer and the third polysilicon layer are patterned to have the first gate structure and the second gate structure, abutting to each other but isolated by the sidewall insulating layer. The first gate structure, the sidewall insulating layer, and the second gate structure are patterned to have a shallow indent above the sidewall insulating layer, wherein the sidewall insulating layer becomes the insulating layer in contact between the first gate structure and the second gate structure. The shallow indent isolation is formed in the shallow indent.

In an embodiment, as to the method for fabricating memory device, the step of forming the shallow indent isolation comprises forming a liner layer on a sidewall and a bottom of the shallow indent and forming a dielectric layer to further fill the shallow indent.

In an embodiment, the invention also provides a method for fabricating memory device. The method comprises forming an oxide layer on the substrate In addition, a first-stage first gate structure is formed on the substrate, having a charge storage layer with a portion of the oxide layer on the substrate, a first polysilicon layer on the charge storage layer, a dielectric layer on the first polysilicon layer, and a second polysilicon layer on the dielectric layer. A first insulating layer is formed on a sidewall of the first-stage first gate structure but lower than the dielectric layer to expose a top side portion of the first polysilicon layer. A second insulating layer is formed on the sidewall of the first-stage first gate structure. An isolation structure is also formed, laterally extending from the second insulating layer into the first polysilicon layer at the exposed top side portion. A third polysilicon layer is formed over the first-stage first gate structure and the oxide layer on the substrate. The third polysilicon layer, the second insulating layer and the second polysilicon layer are polished until the dielectric layer is exposed, wherein the first-stage first gate structure becomes a first gate structure. The third polysilicon layer is patterned to have a second gate structure having the oxide layer on the substrate, adjacent to and isolated from the first gate structure by the first insulating layer and the second insulating layer with the isolation structure.

In an embodiment, as to the method for fabricating memory device, the step for forming the second insulating layer comprises performing a thermal oxidation process to form an oxide layer on the sidewall of the first-stage first gate structure, wherein the exposed side portion of the first polysilicon layer is also oxidized to have the isolation structure.

In an embodiment, as to the method for fabricating memory device, the step for forming the second insulating layer further comprises forming a nitride layer at a side portion in contact with a sidewall of the second gate structure.

In an embodiment, as to the method for fabricating memory device, the charge storage layer comprises a structure of oxide-nitride-oxide (ONO).

In an embodiment, as to the method for fabricating memory device, the method further comprises forming a silicide layer on a top of the second gate structure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2A to FIG. 2I are cross-sectional views, schematically illustrating the process flows for fabricating a memory device, according to an embodiment of the invention.

DESCRIPTION OF THE EMBODIMENTS

The invention is directed to a structure of memory device and method for fabricating the memory device. The memory device may be a 2T SONOS memory device. An isolation capability between the two gate structures, such as selection gate and the storage gate may be improved. In this situation, breakdown of the memory device may be effectively reduced by improve the isolation effect at the top regions between the two gate structures.

Several embodiments are provided for describing the invention but the invention is not just limited to the embodiments as provided. Further, some of the embodiments as provided may be properly combined into another embodiment.

Figure 1:
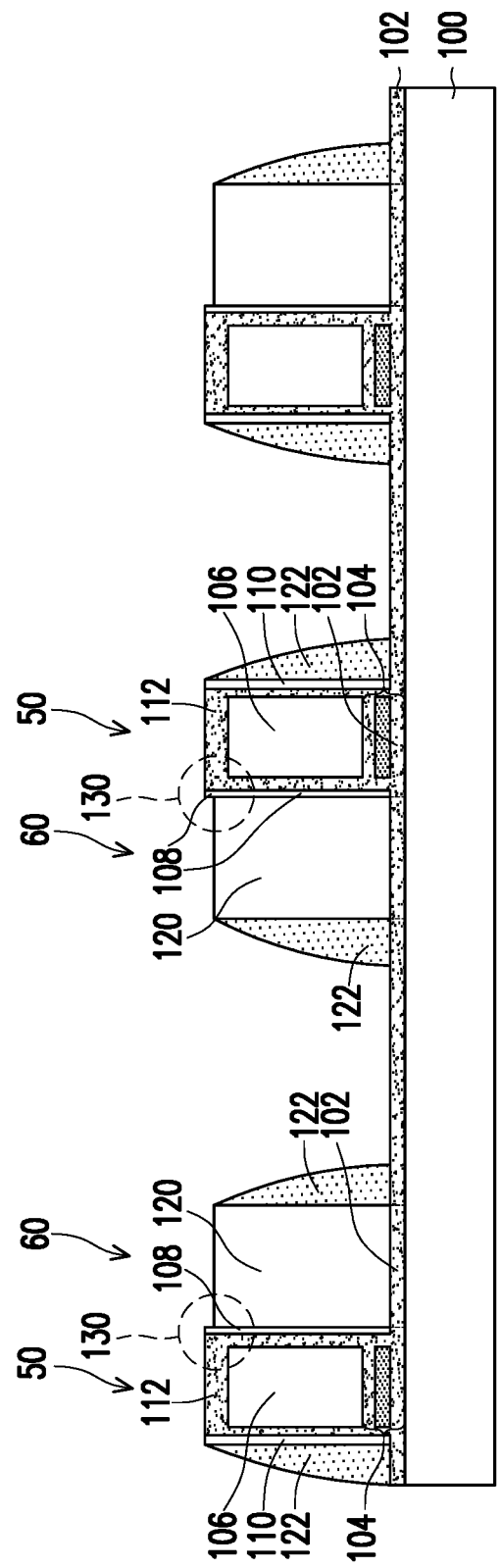
FIG. 1 is a drawing, schematically illustrating a cross-sectional structure of a 2T SONOS memory device as to be looked into in the invention.

The invention has looked into the memory device with a structure of 2T SONOS memory cell and addresses at least an issue. FIG. 1 is a drawing, schematically illustrating a cross-sectional structure of a 2T SONOS memory device as to be looked into in the invention.

Referring to FIG. 1, a structure of 2T SONOS memory cell is taken in the invention to look into. The gate structure for the 2T memory cell comprises a memory gate structure 50 and a selection gate structure 60 disposed over a substrate 100. IN detail, an oxide layer 102 is disposed on the substrate 100, in which a portion of the oxide layer 102 under the selection gate 120 is serving as a gate insulating layer. For memory function, the oxide-nitride-oxide (ONO) layer 104 under the control gate 106 is a charge storage layer to store the data, in which a portion of the oxide layer 102 is also provided as a part of the ONO layer 104.

Additionally, the isolation structure 112 may be formed on sidewall and a top of the control gate 106 for further isolation. To have better isolation to the control gate 106, the nitride spacers 108, 110 may be further formed on the sidewalls. The further spacer 122 is formed to isolate the memory cell on the control gate 106 and the selection gate 120.

In this structure of 2T SONOS memory cell, the memory gate structure 50 and the selection gate structure 60 are about same height because a polishing process is involved in forming the selection gate 120. The polishing process also provides the planarization effect.

As looking into the structure above in FIG. 1, the memory gate structure 50 and the selection gate structure 60 are isolated by the nitride 108 and a side portion of the isolation structure 112. The isolation effect at the region 130 is weak as at least observed in the invention and a breakdown of the memory cell would occur with higher possibility.

After looking into the issue in FIG. 1, the invention provides a structure of memory device and method for fabricating the memory device. As a result, the isolation effect at the reason 130 may be effectively improved. The possibility of breakdown for the memory cell may be at least effectively reduced.

Several embodiments are provided to describe the inventions and the invention is not just limited to the embodiments as provided.

FIG. 2A to FIG. 2I are cross-sectional views, schematically illustrating the process flows for fabricating a memory device, according to an embodiment of the invention.

Figure 2A:
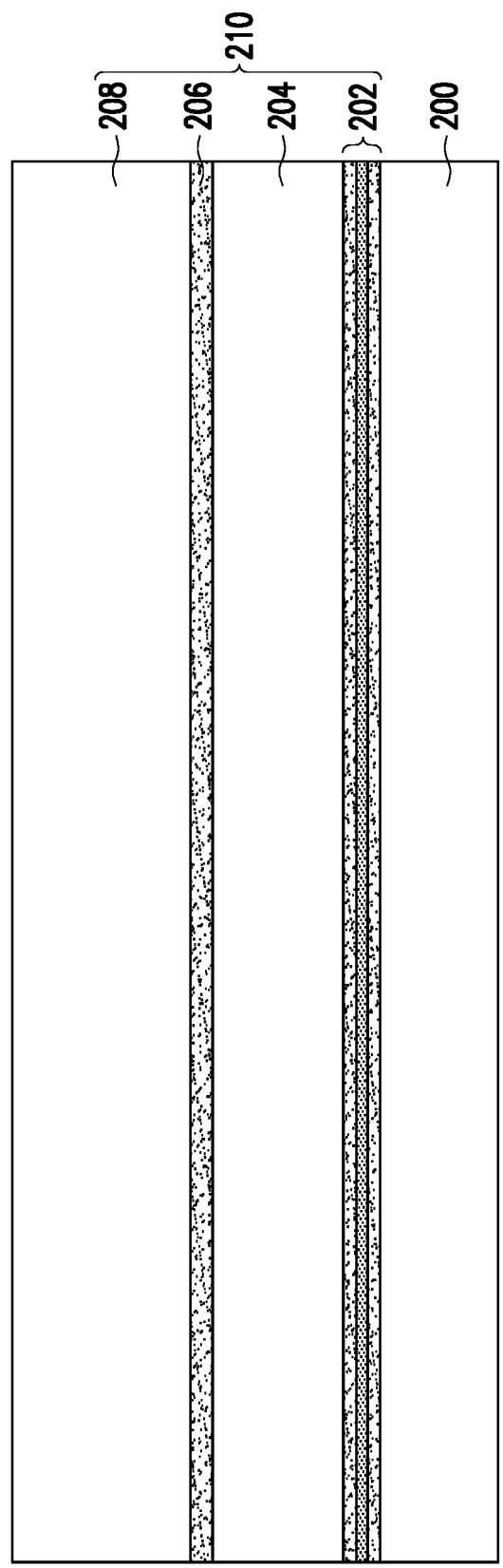

Referring to FIG. 2A, a substrate 200 is provided as a structure base. A charge storage layer 202 is formed on the substrate 200. The charge storage layer 202 is used to store the charges according to the operation voltages on the memory cell. The charge storage layer 202 in an embodiment may be an ONO layer, in which the charges may be kept at the nitride layer thereof.

A polysilicon layer 204, serving as a memory gate layer as latterly patterned, is disposed on the charge storage layer 202. The polysilicon layer 204 is formed at current stage but would be patterned into the actual memory gate latter. A dielectric layer 206 is formed on polysilicon layer 204. The dielectric layer 206 in an embodiment may be tetraethoxysilane (TEOS) material. Another polysilicon layer 208 serving as a mask in an embodiment is formed on the dielectric layer 206. The charge storage layer 202, the polysilicon layer 204, the dielectric layer 206 and the polysilicon layer 208 together can be referred as a stacked layer 210, disposed on the substrate. The stacked layer 210 would be patterned into a memory fat structure.

Figure 2B:
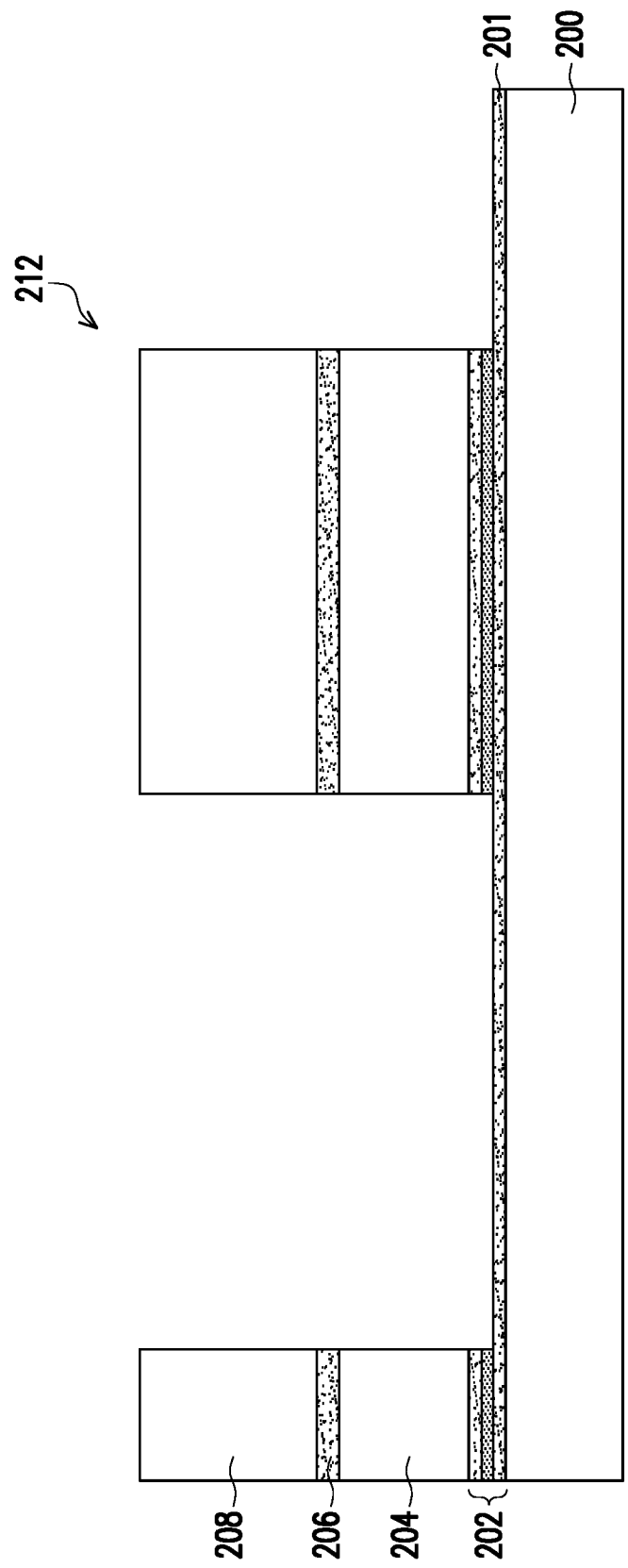

Referring to FIG. 2B, the stacked layer 210 is patterned to remove a portion of the stack layer 210. The remaining portion of the stacked layer 210 structurally becomes another stacked layer 212. Here as to the ONO layer for the charge storage layer 202 in an example, the bottom oxide layer 201 of the ONO layer 202 may be removed to actually expose the substrate 200 or may remain on the substrate 200 without limitation to. In the embodiment, the bottom oxide layer of the ONO layer remains on the substrate 200.

As noted in the embodiments above, the stacked layer 210 is patterned into the stacked layer 212 for two memory cells. However, in another embodiment, the stack layer 210 may be directly patterned into the actual width of the memory gate structure as designed for a single cell. The invention is not limited to the embodiments as provided.

Figure 2C:
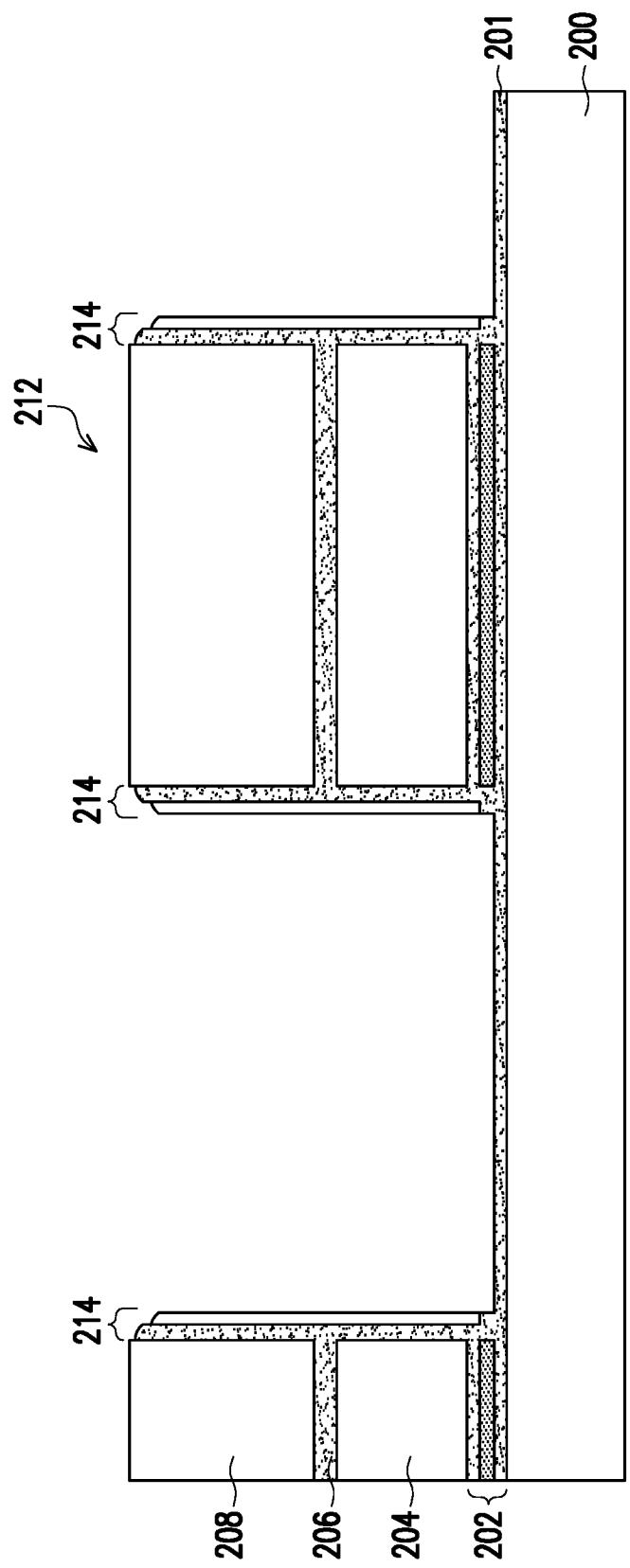

Referring to FIG. 2C, an insulating layer 214, such as a spacer, is formed on sidewalls of the stacked layer 212. The insulating layer 214 may be a stake of oxide and nitride in an embodiment. The insulating layer 214 is used to insulate between the memory gate and the selection gate therebetween as to be described. The insulating layer 214 would merge with the dielectric layer 206 to enclose the polysilicon layer 204. The insulating layer 214 is also used to isolate between the memory gate and the selection gate as to be formed later.

Figure 2D:
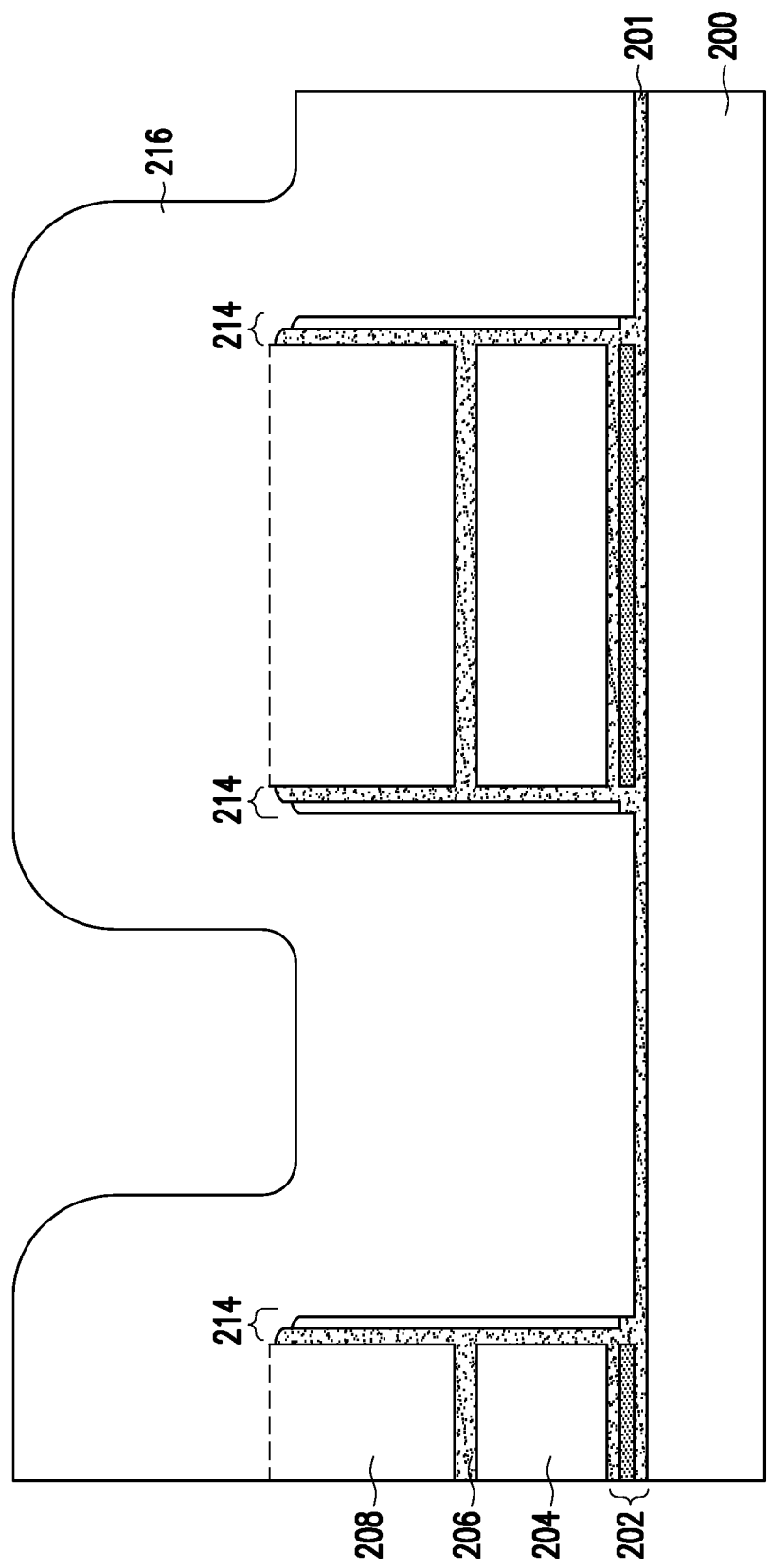

Referring to FIG. 2D, another polysilicon layer 216 is deposited over the substrate 200, in which the space between the stacked layer 212 above the bottom oxide layer 201 is also filled by the polysilicon layer 216. The polysilicon layer 216 is to be processed later into a selection gate. In this stage, the polysilicon layer 216 merges with the polysilicon layer 208 of the stacked layer 212.

Figure 2E:
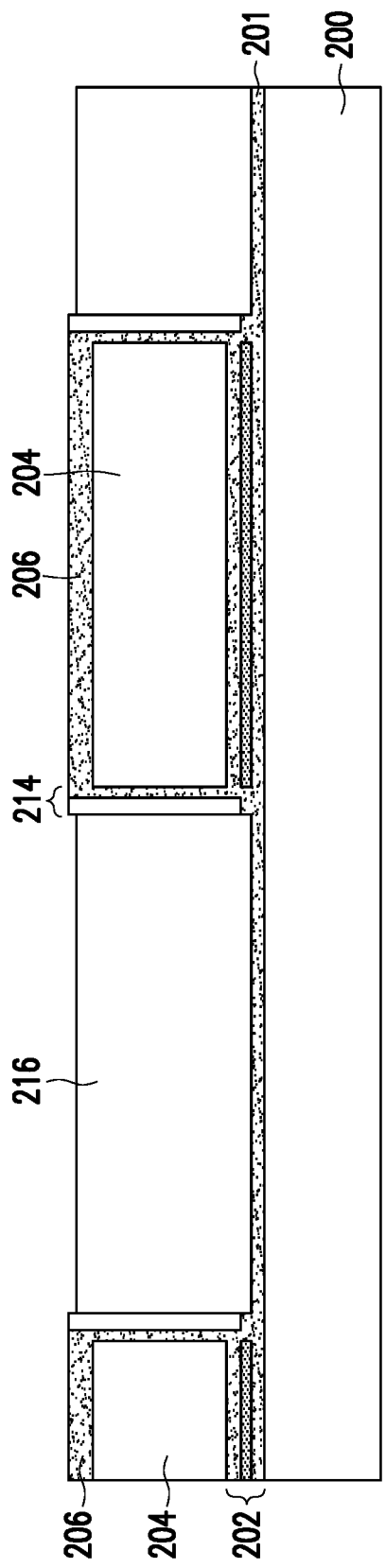

Referring to FIG. 2E, a polishing process such as chemical mechanical polishing (CMP) process is performed to mainly polish the polysilicon layers 216 and 208 and the insulating layer 214. The polishing process stops at the dielectric layer 206, in which a planarization effect is achieved. After the polishing process, the remaining portion of the polysilicon layer 216 at the current stage is isolated form the polysilicon layer 204 by the insulation layer 214. As noted, the polysilicon layer 216 is also referred as a selection gate layer. The polysilicon layer 204 and the polysilicon layer 216 serving as a preliminary selection gate layer indicated.

Figure 2F:
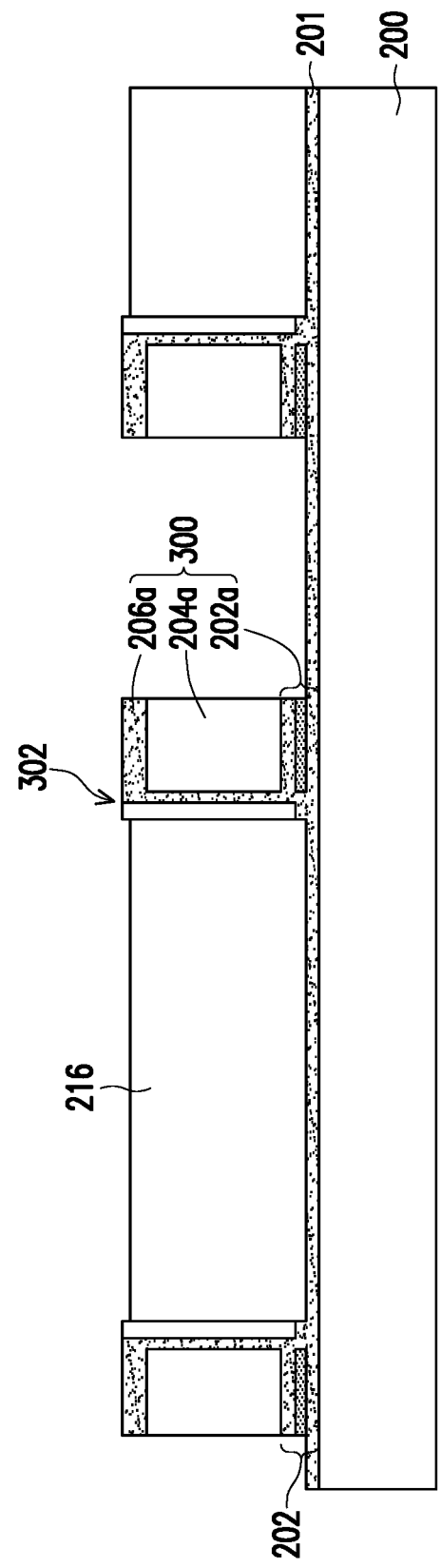

Referring to FIG. 2F, in an embodiment, the dielectric later 206 and the polysilicon layer 204 are patterned to remove the middle region, so that the remaining portion of the polysilicon layer 204 is the actual size to sever as a memory gate located at two sides for two memory cells. The width of the polysilicon layer 204 is satisfying a designed range. At this stage, a memory gate structure 300, is basically formed by the remaining portion of the dielectric layer 206, the polysilicon layer 204, the charge storage layer 202, which layers now change to the dielectric layer 206a, the memory gate 204a, the charge storage layer 202a as comprised in a memory gate structure 300. As further noted, in an embodiment, the bottom oxide layer 201 of the charge storage layer 202 may still remain to cover the substrate 200 in the patterning process as an embodiment. However, the bottom oxide layer 201 of the charge storage layer 202 may be removed as well but formed later according to the actual need. The insulating layer 214 at this stage is generally referred as the insulation layer 302, which may include the oxide layer and the nitride layer extending in a vertical direction.

Figure 2G:
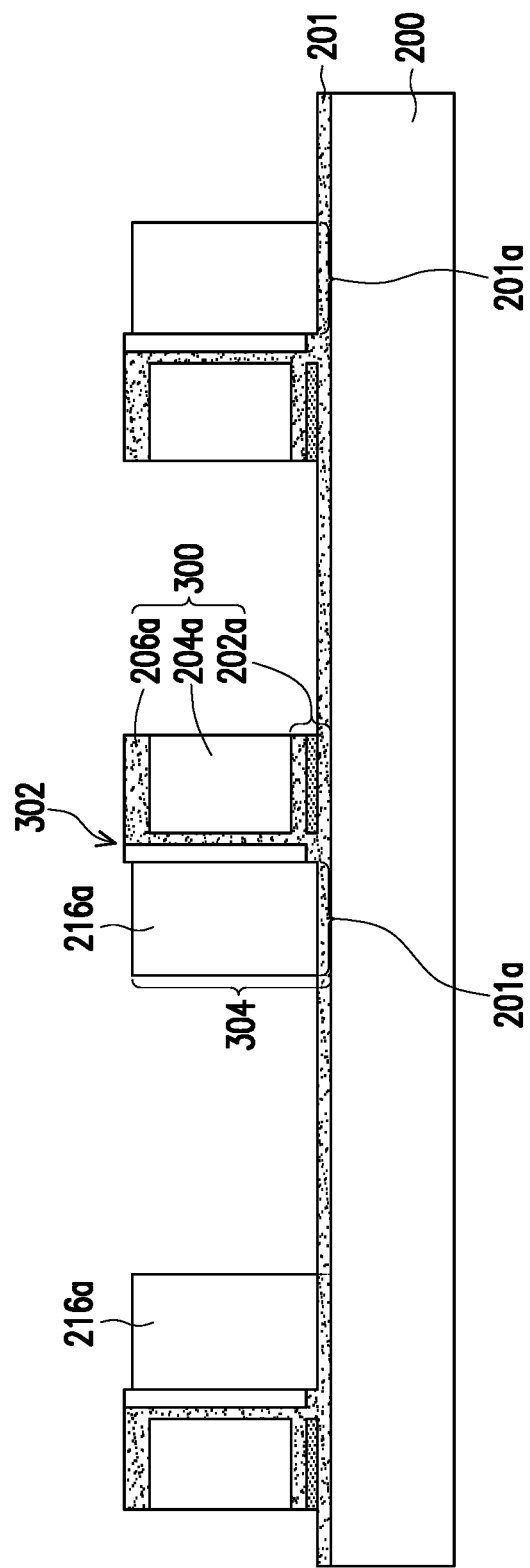

Referring to FIG. 2G, the polysilicon layer 216 is then patterned into the selection gate 216a with the actual size as needed. The selection gate 216a is next to the memory gate 204a but isolated by the insulating layer 302. The remaining portion of the of the polysilicon layer 216 is referred as the polysilicon layer 216a. The selection gate structure 304 include the polysilicon layer 216a and the gate insulating layer 201a, which is a portion of the bottom oxide layer 201 in an example. Here, in an embodiment, the polysilicon layer 216 and the polysilicon layer 204 may be patterned in the same patterning process, in an example.

At the current stage, the memory gate structure 300 and the selection gate structure 304 are preliminarily formed. The memory gate structure 300 and the selection gate structure 304 are isolated by the insulating layer 302, in which the insulating layer 302 is thin and the height of the memory gate structure 300 and the selection gate structure 304 are about the same. The issue at the region 130 addressed in FIG. 1 would possibly occur, due to insufficient isolation capability at top between the two gate structures.

Figure 2H:
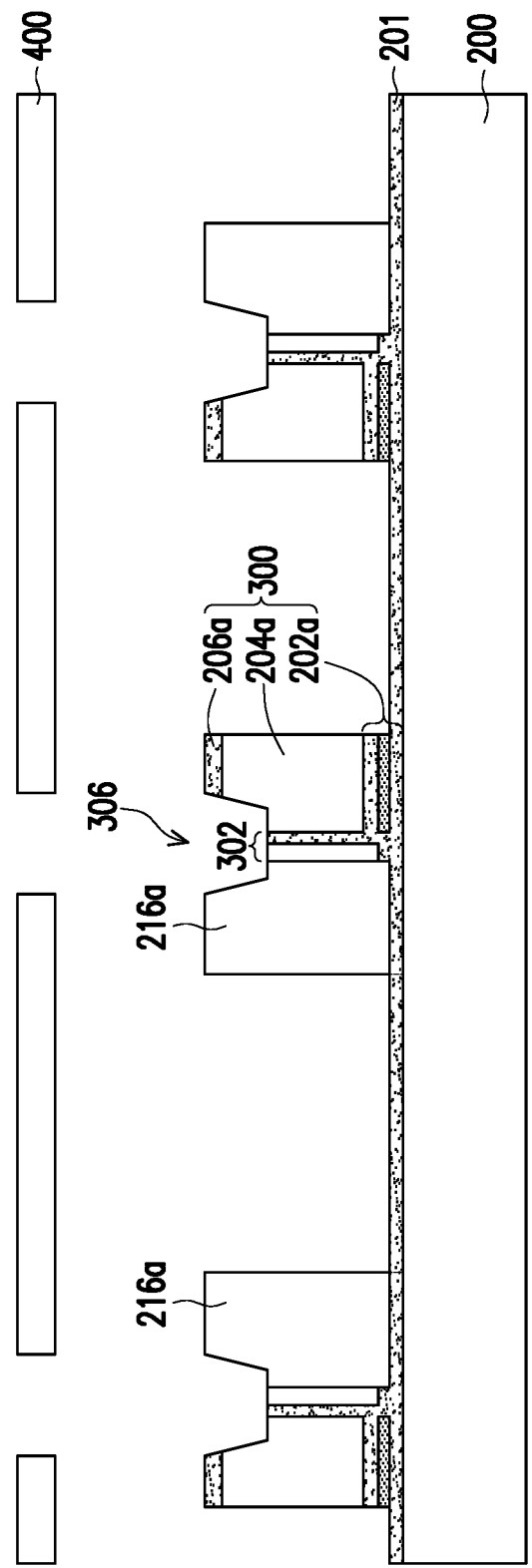
Figure 21:
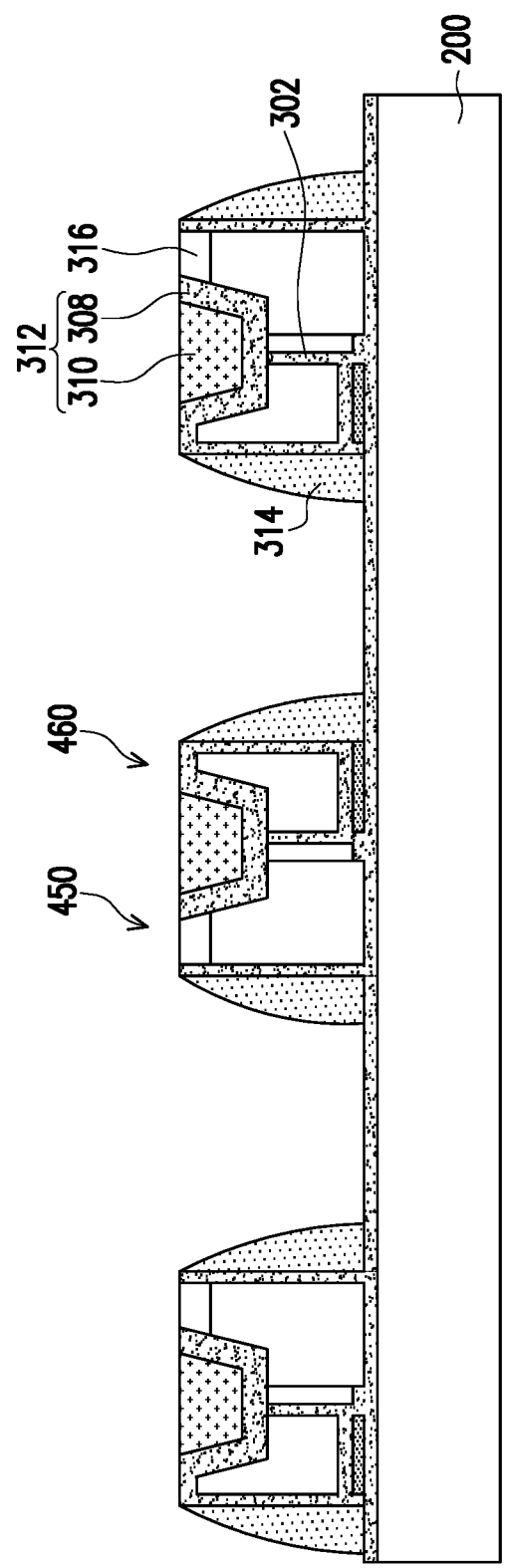

Referring to FIG. 2H, in an embodiment, an etching mask 400 is provided to etch and form a shallow indent 306 in the memory gate structure 300 and the selection gate structure 304 above the insulating layer 302.

Referring to FIG. 2I, in an embodiment, an isolation structure 312 is formed into the shallow indent 306 as a shallow indent isolation. The isolation structure 312 in an embodiment may include a liner layer 308 on the sidewall and the bottom of the shallow indent 306. Then another dielectric layer 310 fully fills the shallow indent 306.

Further, a silicide layer 316 may be also formed on the exposed surface of the polysilicon layer 216a of the selection gate structure 304. Further, an oxide spacer 314 may be further formed on the sidewall of the 2T SONOS memory cell. However, the invention is not limited to the embodiments.

As noted, the isolation structure 312 is integrated with the insulating layer 302 between the memory gate structure 300 and the selection gate structure 304 and at a top portion. The isolation structure 312 provides an isolation distance between the memory gate structure 300 and the selection gate structure 304, so that the isolation capability may be effectively improved. In an embodiment, the isolation structure 312 may have a width such as about 500 angstroms and a depth such as about 200 angstroms. However, the size is the limitation of the invention and may be adjusted according to the actual sizes for the memory gate structure 450 and the selection gate structure 460.

As to the mechanism of the isolation structure 312, the isolation structure 312 may be formed in another manner for another embodiment.

FIG. 3A to FIG. 3D are cross-sectional views, schematically illustrating the process flows for fabricating a memory device, according to an embodiment of the invention.

Figure 3A:
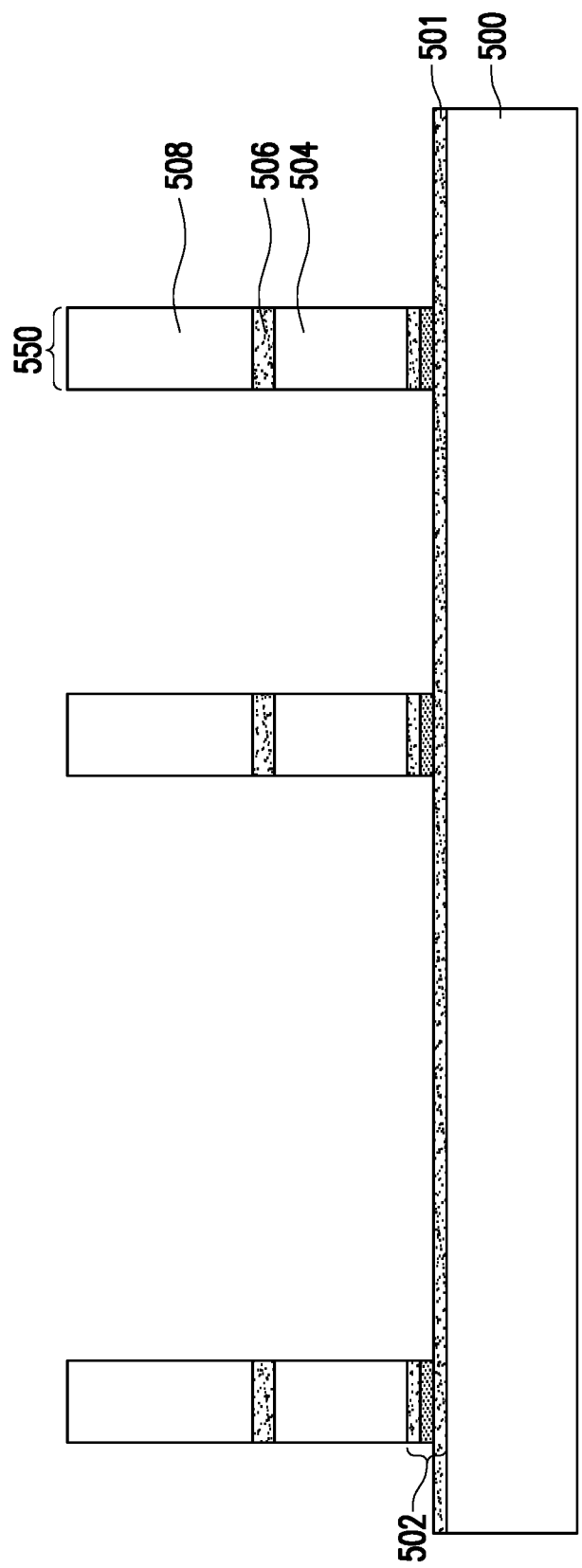
FIG. 3A to FIG. 3D are cross-sectional views, schematically illustrating the process flows for fabricating a memory device, according to an embodiment of the invention.

Referring to FIG. 3A, in an embodiment, based on the stack layer 210 in FIG. 2A, the preliminary memory gate structures 550 are formed on the substrate 500, in which the bottom oxide layer 501 is reserved on the substrate 500 in an embodiment. The preliminary memory gate structures 550 includes an ONO layer 502, a polysilicon layer 504, a dielectric layer 506 and a polysilicon layer 508. The ONO layer 502 including a portion of the bottom oxide layer 501 is on the substrate 500. The polysilicon layer 504, serving as a control gate later, is on the ONO layer 502. The dielectric layer 506 is on the polysilicon layer 504 and the polysilicon layer 508, serving as a mask layer during fabrication process, is on the dielectric layer 506.

Figure 3B:
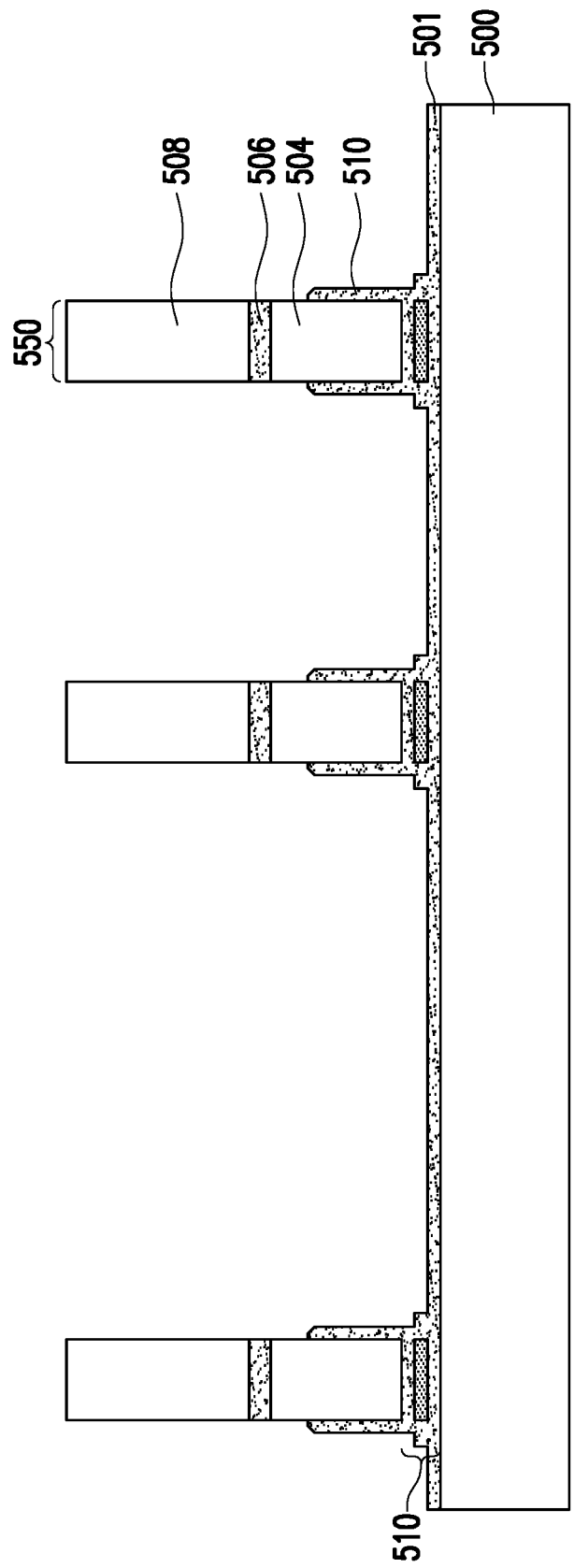

Referring to FIG. 3B, a first insulating layer 510 is formed on the sidewall of the polysilicon layer 504 at the lower portion, lower than the dielectric layer 506. A top portion of the sidewall of the polysilicon layer 504 is exposed by the first insulating layer 510.

Figure 3C:
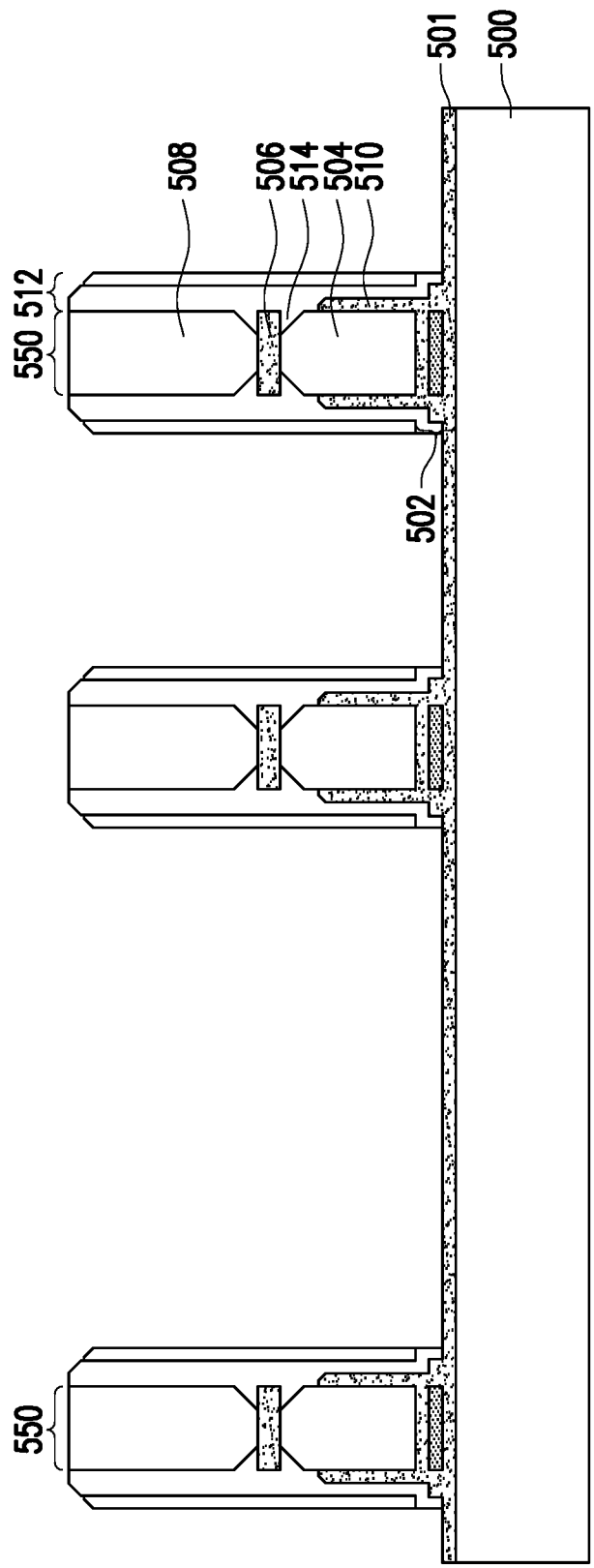

Referring to FIG. 3C, a second insulating layer 512 is further formed on the sidewall of the preliminary memory gate structures 550. In an embodiment, the second insulating layer 512 includes an oxide layer which may cover the first insulating layer 510 and the top portion of the sidewall of the polysilicon layer 504 as exposed by the first insulating layer 510 and also cover the other portion of the sidewall of the preliminary memory gate structures 550. In addition, a nitride layer may be additionally formed on the oxide layer.

As noted, the oxide layer of the second insulating layer 512 is formed by thermal oxidation process. In this manner, the polysilicon material of the polysilicon layer 504 and polysilicon layer 508 in contact with the dielectric layer 506 additionally oxidized to have the laterally oxidation portion, entering into the polysilicon layer 504 at the top portion. The laterally oxidation portion is referred as the isolation structure 514. The isolation structure 514 has the similar isolation function to the isolation structure 312 in FIG. 2I. In this embodiment, the isolation structure 514 laterally extends into polysilicon layer 504 and merges with the second insulating layer 512. The detail is further described as follows.

Figure 3D:
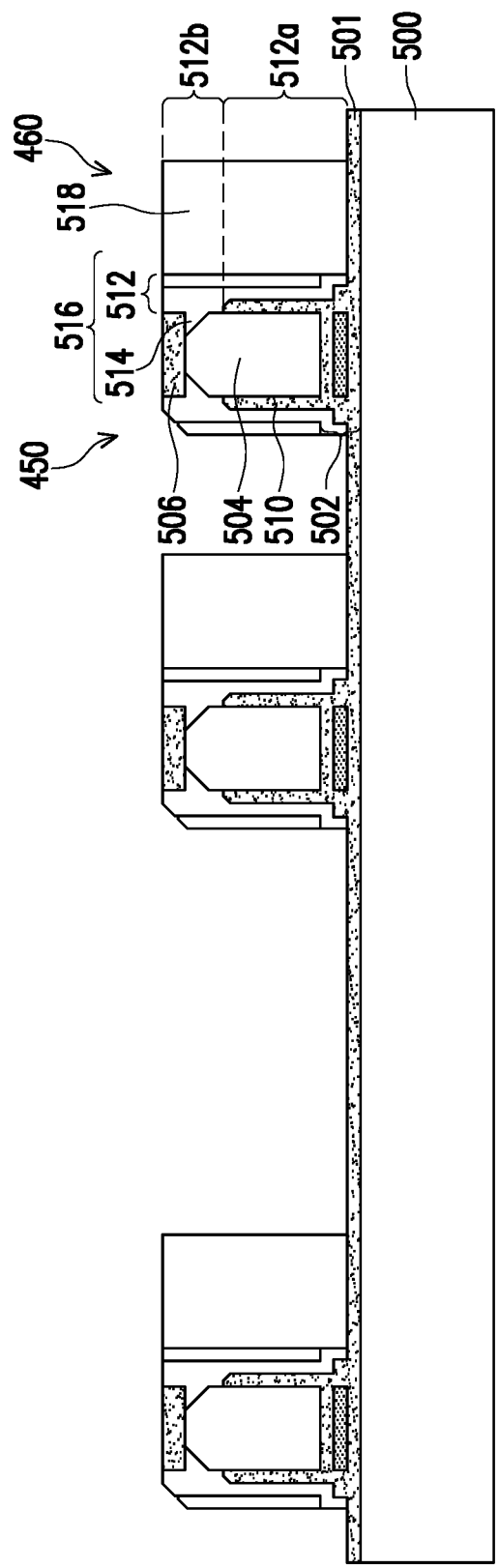

Referring FIG. 3D, similar to the process in FIG. 2D to FIG. 2I, a preliminary polysilicon layer may be deposed over the substrate. Further, a polishing process is performed on the preliminary polysilicon and the polysilicon layer 508 and stops ate the dielectric layer 506. Then, the preliminary polysilicon layer is patterned into the polysilicon layer 518 abutting to the polysilicon layer 504. After polishing process, the insulating layer 516 is formed to isolate the polysilicon layer 518 abutting to the polysilicon layer 504. The polysilicon layer 504 and the ONO layer 502 form a memory gate structure 450, also referred as a first gate structure. The polysilicon layer 518 and a portion of the bottom oxide layer 501 form a selection gate structure 460, also referred as a second gate structure.

As to the structure, the second insulating layer 512 merges with the isolation structure 514 on the sidewall of the memory gate structure 450. The second insulating layer 512 as viewed in structure may comprise the first portion 512a covering the first insulating layer 510 and a second portion 512b merges with the isolation structure 514 covering on the peripheral top portion of the memory gate structure 450. The isolation structure has the same mechanism to the isolation structure 312 in FIG. 2I.

The subsequent fabrication processes, such as the formation of the spacer of the memory cell and also the source/drain regions in an example may be performed but not further described here.

The invention has proposed that the insulating layer 302, 516 is formed with the isolation structure 312, 514, so that the isolation between the control gate and the selection gate may be improved. The occurrence of breakdown in operation for the 2T SONOS memory cell may be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating memory device, comprising:
 forming a cell structure on a substrate, wherein the cell structure comprises a first gate structure and a second gate structure disposed on a substrate and an insulating layer in contact between the first gate structure and the second gate structure, wherein the first gate structure and the second gate structure are planarized and the first gate structure is for storing charges;
 patterning the first gate structure and the second gate structure to have a shallow indent above the insulating layer; and
 forming an isolation structure in the shallow indent to have a shallow indent isolation, wherein forming the cell structure comprises:
  forming an oxide layer on the substrate;
  forming a first-stage first gate structure, having a charge storage layer with a portion of the oxide layer on the substrate, a first polysilicon layer on the charge storage layer, a dielectric layer on the first polysilicon layer, a second polysilicon layer on the dielectric layer, and a sidewall insulating layer on a sidewall of the first polysilicon layer, the dielectric layer and the second polysilicon layer;

forming a third polysilicon layer over the first-stage first gate structure and the oxide layer on the substrate;

polishing the third polysilicon layer, the sidewall insulating layer and the second polysilicon layer until the dielectric layer is exposed;

patterning the second polysilicon layer and the third polysilicon layer to have the first gate structure and the second gate structure, abutting to each other but isolated by the sidewall insulating layer;

patterning the first gate structure, the sidewall insulating layer, and the second gate structure to have a shallow indent above the sidewall insulating layer, wherein the sidewall insulating layer becomes the insulating layer in contact between the first gate structure and the second gate structure; and forming the shallow indent isolation in the shallow indent.

2. The method for fabricating memory device as recited in claim 1, wherein the step of forming the shallow indent isolation comprises:

forming a liner layer on a sidewall and a bottom of the shallow indent; and forming a dielectric layer to further fill the shallow indent.

3. A method for fabricating memory device, comprising:

forming an oxide layer on the substrate;

forming a first-stage first gate structure on the substrate, having a charge storage layer with a portion of the oxide layer on the substrate, a first polysilicon layer on the charge storage layer, a dielectric layer on the first polysilicon layer, and a second polysilicon layer on the dielectric layer;

forming a first insulating layer on a sidewall of the first-stage first gate structure but lower than the dielectric layer to expose a top side portion of the first polysilicon layer;

forming a second insulating layer on the sidewall of the first-stage first gate structure, wherein an isolation structure is also formed, laterally extending from the second insulating layer into the first polysilicon layer at the exposed top side portion;

forming a third polysilicon layer over the first-stage first gate structure and the oxide layer on the substrate;

polishing the third polysilicon layer, the second insulating layer and the second polysilicon layer until the dielectric layer is exposed, wherein the first-stage first gate structure becomes a first gate structure; and patterning the third polysilicon layer to have a second gate structure having the oxide layer on the substrate, adjacent to and isolated from the first gate structure by the first insulating layer and the second insulating layer with the isolation structure.

4. The method for fabricating memory device as recited in claim 3, wherein the step for forming the second insulating layer comprises:

performing a thermal oxidation process to form an oxide layer on the sidewall of the first-stage first gate structure, wherein the exposed side portion of the first polysilicon layer is also oxidized to have the isolation structure.

5. The method for fabricating memory device as recited in claim 4, the step for forming the second insulating layer further comprises forming a nitride layer at a side portion in contact with a sidewall of the second gate structure.

6. The method for fabricating memory device as recited in claim 3, the charge storage layer comprises a structure of oxide-nitride-oxide (ONO).

7. The method for fabricating memory device as recited in claim 3, further comprising forming a silicide layer on a top of the second gate structure.

\* \* \* \* \*